United States Patent
Habel et al.

(10) Patent No.: US 7,727,332 B2
(45) Date of Patent: Jun. 1, 2010

(54) PROCESS FOR SELECTIVE MASKING OF III-N LAYERS AND FOR THE PREPARATION OF FREE-STANDING III-N LAYERS OR OF DEVICES, AND PRODUCTS OBTAINED THEREBY

(75) Inventors: Frank Habel, Freiberg (DE); Ferdinand Scholz, Ulm (DE); Barbara Neubert, Ulm (DE); Peter Brückner, Tettnang (DE); Thomas Wunderer, Waltenhofen (DE)

(73) Assignee: Freiberger Compound Materials GmbH, Freiberg (DE)

( * ) Notice: Subject to any disclaimer, the term of this patent is extended or adjusted under 35 U.S.C. 154(b) by 663 days.

(21) Appl. No.: 11/614,508

(22) Filed: Dec. 21, 2006

(65) Prior Publication Data
US 2007/0163490 A1    Jul. 19, 2007

Related U.S. Application Data

(60) Provisional application No. 60/752,360, filed on Dec. 22, 2005.

(51) Int. Cl.
*C30B 28/12* (2006.01)
*C30B 25/00* (2006.01)

(52) U.S. Cl. .................... 117/88; 117/92; 117/104; 117/108

(58) Field of Classification Search .............. 117/88, 117/92, 104, 108
See application file for complete search history.

(56) References Cited

U.S. PATENT DOCUMENTS 4,272,776 A * 6/1981 Weijland et al. ............ 257/511
5,212,113 A * 5/1993 Azoulay et al. ............. 438/504

(Continued)

FOREIGN PATENT DOCUMENTS

JP    2004-51415 A    2/2004

(Continued)

OTHER PUBLICATIONS

Craven et al., "Threading dislocation reduction via laterally overgrown nonpolar (1120) *a*-plane GaN", Applied Physiques Letters, vol. 81, 2002, pp. 1201-1203.

(Continued)

*Primary Examiner*—G. Nagesh Rao
(74) *Attorney, Agent, or Firm*—Foley & Lardner LLP

(57) ABSTRACT

In a process for forming a mask material on a III-N layer, wherein III denotes an element of the group III of the Periodic Table of Elements, selected from Al, Ga and In, a III-N layer having a surface is provided which comprises more than one facet. Mask material is selectively deposited only on one or multiple, but not on all facets. The deposition of mask material may be particularly carried out during epitaxial growth of a III-N layer under growth conditions, by which (i) growth of at least a further III-N layer selectively on a first type or a first group of facet(s) and (ii) a deposition of mask material selectively on a second type or a second group of facet(s) proceed simultaneously. By the process according to the invention, it is possible to produce free-standing thick III-N layers. Further, semiconductor devices or components having special structures and layers can be produced.

20 Claims, 3 Drawing Sheets

U.S. PATENT DOCUMENTS

| | | | |
|---|---|---|---|
| 5,294,565 A * | 3/1994 | Shiraishi | 117/95 |
| 6,015,979 A * | 1/2000 | Sugiura et al. | 257/86 |
| 6,413,627 B1 * | 7/2002 | Motoki et al. | 428/332 |
| 6,447,604 B1 * | 9/2002 | Flynn et al. | 117/89 |
| 6,740,906 B2 * | 5/2004 | Slater et al. | 257/99 |
| 6,802,902 B2 | 10/2004 | Beaumont et al. | |
| 6,809,351 B2 * | 10/2004 | Kuramoto et al. | 257/190 |
| 6,964,705 B2 | 11/2005 | Nagai et al. | |
| 7,303,630 B2 * | 12/2007 | Motoki et al. | 117/94 |
| 2004/0137732 A1 | 7/2004 | Frayssinet et al. | |
| 2005/0092234 A1 * | 5/2005 | Motoki et al. | 117/91 |
| 2005/0194603 A1 * | 9/2005 | Slater et al. | 257/98 |
| 2005/0277218 A1 * | 12/2005 | Nakajo et al. | 438/46 |
| 2006/0264009 A1 * | 11/2006 | Wang | 438/479 |

FOREIGN PATENT DOCUMENTS

JP          2004-55799 A          2/2004

OTHER PUBLICATIONS

H.M. Ng, "Molecular-beam epitaxy of $GaN/Al_xGa_{1-x}N$ multiple quantum wells on $R$-plane ($10\bar{1}\bar{2}$) sapphire substrates", Applied Physiques Letters, vol. 80, 2002, pp. 4369-4371.

Waltereit et al., "Growth of $M$-plane GaN($1\bar{1}00$) on $\gamma LiAlO_2(100)$", Journal of Crystal Growth, 218, 2000, pp. 143-147.

I. Kidoguchi et al., "Air-bridged lateral epitaxial overgrowth of GaN thin films", Applied Physics Letters, vol. 76, No. 25, 2000, pp. 3768-3770.

Z.R. Zytkiewicz, "Laterally overgrown structures as substrates for lattice mismatched epitaxy", Thin Solid Films 412, 2002, pp. 64-75.

T.S. Zheleva et al., "Pendeo-Epitaxy versus Lateral Epitaxial Overgrowth of GaN: A Comparative Study via Finite Element Analysis", Phys. Stat. Sol. (a) 176, 1999, pp. 545-551.

B. Beaumont et al., "Magnesium induced changes in the selective growth of GaN by metalorganic vapor phase epitaxy", Applied Physics Letters, vol. 72, No. 8, 1998, pp. 921-923.

K. Kawasaki et al., "Formation of GaN nanopillars by selective area growth using ammonia gas source molecular beam epitaxy", Journal of Crystal Growth 243, 2002, pp. 129-133.

Tomita et al., "Self-Separation of Freestanding GaN from Sapphire Substrates by Hydride Vapor Phase Epitaxy", Phys. Stat. Sol. (a) 194, No. 2 (2002), pp. 563-567.

Oshima et al., "Fabrication of Freestanding GaN Wafers by Hydride Vapor-Phase Epitaxy with Void-Assisted Separation", Phys. Stat. Sol. (a) 194, No. 2 (2002), pp. 554-558.

Usui et al., "Role of TiN Film in the Fabrication of Freestanding GaN Wafers Using Hydride Vapor Phase Epitaxy with Void-Assisted Separation", Phys. Stat. Sol. (a) 194, No. 2 (2002), pp. 572-575.

Bohyama et al., "Freestanding GaN Substrate by Advanced Facet-Controlled Epitaxial Lateral Overgrowth Technique with Masking Side Facets", Jap. Journal of Appl. Physics, vol. 44, No. 1 (2005), pp. L24-L26.

Hiramatsu et al., "Recent Progress in Selective Area Growth and Epitaxial Lateral Overgrowth of III-Nitrides: Effects of Reactor Pressure in MOVPE Growth", Phys. Stat. Sol. (a) 176 (1999), pp. 535-543.

Neubert et al., "GaInN quantum wells grown of facets of selectively grown GaN stripes", Appl. Physcis Letters 87 (2005), pp. 182111-182113.

* cited by examiner

PROCESS FOR SELECTIVE MASKING OF III-N LAYERS AND FOR THE PREPARATION OF FREE-STANDING III-N LAYERS OR OF DEVICES, AND PRODUCTS OBTAINED THEREBY

CROSS-REFERENCE TO RELATED PATENT APPLICATIONS

The present application claims benefit of priority to U.S. Provisional Application Ser. No. 60/752,360 filed Dec. 22, 2005, the entire contents of which is incorporated herein by reference.

BACKGROUND OF THE INVENTION

The invention relates to a process for the selective covering of predetermined crystal facets (crystal planes) during the growth, and in particular the epitaxial growth of group III-nitrides (in short: III-N), especially of (Al, Ga, In) N, as well as processes for the preparation of freestanding III-N layers and of devices or components, as well as to products such as optoelectronic and electronic devices obtained by such processes.

SUMMARY OF THE INVENTION

The material system III-N, wherein III denotes at least one element of group III of the Periodic Table, selected from the group consisting of Al, Ga and In, currently plays a significant role among semiconductor materials. It is used for a range of optoelectronic and electronic devices. The masking of predetermined portions of semiconductor wafers is used in a variety of applications when preparing or manufacturing new devices as well as when separating the III-N layers from a foreign substrate.

The in situ deposition of dielectric materials is known (U.S. Pat. No. 6,802,902, US-A-20040137732); however, only non-structured substrates are described, which respectively have only one certain crystal facet (crystal plane) at the surface. Further, the whole wafer is covered entirely by a mask. This process therefore can only be used for reducing the dislocation density or also for the relaxation of strains, but not for the manufacture of complex structures.

K. Tomita et al., in phys. stat. sol. (a), 194, p. 563 (2002), describe the preparation of freestanding bulk GaN layers by self-separation. Outside an epitaxy reactor for the growth of the GaN layer, a single mask is generated in one step on a sapphire foreign substrate. Starting from exposed portions of the mask, an epitaxial lateral overgrowth across the mask is carried out for the formation of the thick GaN layer. The thus formed GaN layer separated itself from the sapphire substrate.

In the processes described in JP-A-2004-051415 and JP-A-2004-055799, III-N layers are structured such that, after further growth, only bars or columns remained as connections between the substrate and the III-N layer.

Y. Oshima et al. in phys. stat. sol. (a) 194, p. 554 (2002) and A. Usui et al in phys. stat. sol. (a) 194, p. 572 (2002) describe the preparation of free-standing GaN layers by the so-called "void assisted separation". Again outside of the epitaxy reactor, a TiN layer is formed on a sapphire/GaN substrate. This substrate is converted, in a further annealing step, into a "nano net". The subsequent epitaxial growth of a thick GaN layer leads to micro voids between the substrate and the thick GaN layer.

S. Bohyama et al. (Japanese Journal of Applied Physics, Vol. 44, L24 (2005)) have described the growth on structured substrates, wherein certain crystal facets have been covered by a mask. For this purpose, the external formation of a first mask is necessary, and then an epitaxy step is performed for the generation of the structures.

Then, a second mask is formed, again outside the epitaxy reactor, and has to be structured. Hereby, a $SiO_2$ mask is formed on the GaN layer first, and subsequently the top of the underneath GaN layer is removed again to provide a seed for the further growth. Here, the position of the structures must be aligned exactly above the structures of the first mask.

Furthermore, the formation of quantum (hetero)structures in the III-N material system has attracted interest. Conventionally, III-N quantum wells have however been grown on planes other than the (0010)- or c-plane only on foreign substrates, such as on the r-plane of sapphire, where GaN grows in the a-direction (H. N. Ng, Appl. Phys. Lett. 80, 4369 (2002) and M. D. Craven et al., Appl. Phys. Lett. 81, 120 1 (2002)), or on the m-plane of $LiAlO_2$ substrate (P. Waltereit et al., J. Cryst. Growth 218, 143 (2000)). Neubert et al. (Appl. Phys. Lett. 87, 182111 (2005) have epitaxially grown III-N (namely GaN) quantum wells on III-N (namely GaN) facets, however being unable to grow III-N quantum wells on specific facets only.

It is an object of the invention to improve a process for depositing a mask material on a III-N layer and thereby providing efficient possibilities for the preparation or the provision of a free-standing III-N layer and/or of devices comprising selectively formed subsequent layers in the III-N material system.

In one aspect, the present invention provides a process for the formation of a mask material on a III-N layer, wherein III denotes at least one element of group III of the Periodic Table of Elements, selected from Al, Ga and In, wherein a III-N layer having a surface is provided, which comprises more than one facet; and a mask material is deposited selectively on one or more, but not on all facets.

In a further aspect, the present invention provides a process for the growth of an at least partially masked III-N layer by means of epitaxy, wherein III is denoted as above, wherein the process comprises providing a III-N layer having a surface, which comprises more than one facet; and carrying out epitaxial growth under growth conditions, by which (i) a growth of at least one further III-N layer selectively on a first type or a first group of facet(s) and (ii) a deposition of mask material selectively on a second type or a second group of facet(s) proceed simultaneously.

In another aspect, the present invention further provides a process for the growth of an at least partially masked III-N layer by means of epitaxy in an epitaxy reactor, wherein III denotes at least one element of group III of the Periodic Table of Elements, selected from Al, Ga and In, the process comprising: performing epitaxial growth, during at least a part of the growth process, under growth conditions where growth rates of lateral growth and vertical growth respectively are different, preferably substantially different, and supplying, during a period of respectively different lateral and vertical growth rates, at least one source for a mask material into the epitaxy reactor. In this manner, mask material is allowed to deposit on at least one plane (facet) formed by the lower growth rate. According to this embodiment of the invention, vertical growth rate means the one affecting the horizontal (0001) surface facet, whereas lateral growth rate means the one affecting any one or all of other surface facets, including inclined and/or vertical surface facets.

A suitable difference between lateral and vertical growth rates is defined by a sufficiently significant ratio between the respective lateral and vertical growth rates, or visa versa by a sufficiently significant ratio between the respective vertical and lateral growth rates, in order to achieve a selectivity. For example, "sufficiently significant" means a respective ratio factor being at least 1.5 or higher, preferably at least 3.0 or higher, more preferably at least 5.0 or higher and particularly at least 10.0 or higher.

The different aspects of the process of the present invention commonly provide an advantage that mask material can be selectively and effectively formed on one type or a subgroup of multiple facets that are accessibly provided at the III-N layer. This selective facet-masking deposition can be formed in situ during epitaxial growth of the III-N material having more than one growing facet. A masking of all accessible facets is avoided, thereby allowing the non-masked facet(s) to continuously grow in the III-N material system, including possibilities of forming doped or undoped III-N-homostructures and/or -heterostructures, and of forming selectively further layers of other semiconductor materials. Depending on the desired further processing and depending on which type or which group of facet has been correspondingly selected for the selective masking, the structure thus obtained then allows for useful applications.

In a first aspect of such useful application, the present invention provides a process for the preparation of a free-standing III-N layer (III being denoted as above), wherein a process according to either one of the above mentioned process aspects is performed for forming a selectively masked III-N layer above a substrate, a template or base layer, and a further III-N layer is formed, wherein the selective masking is formed in a region between the further III-N layer and the substrate or template or base layer, and causing the further III-N layer to separate from the substrate, template or base layer, thereby providing the free-standing III-N layer. The formation of the further III-N above the selectively masked III-N layer is allowed to proceed as long as a desired thickness is provided. The separation of the further formed III-N layer of desired thickness may proceed in a self-separation process owing to a structural instability generated by the selective masking process, or may be assisted by a further treatment such as mechanical, chemical, thermal or laser-optical treatment or any combination thereof. Any remaining material of the multifacet III-N layer comprising masking material may be actively removed, if desired or necessary, by suitable treatment such as etching, polishing, CMP or the like.

The free-standing III-N layer formed to a desired thickness may then be used as a substrate for producing optical, electronic or an optoelectronic devices, semiconductor components or the like.

In a second aspect of such useful application, the present invention provides a process for producing a device comprising a III-N material, wherein III is denoted as above, which process comprises the steps of: performing a process according to either one of the above mentioned aspects for forming a selectively masked III-N layer above a substrate, a template or a base layer such that selective masking is formed on at least one facet of the formed multi-facet III-N layer, and forming at least one layer for the device on at least one of non-masked facet(s).

The device obtained by the process according to this embodiment of the invention may be an optical, an electronic or an optoelectronic device, a semiconductor component or the like.

By the processes of the invention, free-standing III-N wafers, or electronic or optoelectronic devices can be manufactured. Such products can be manufactured with improved properties.

The invention can be applied to crystalline, particularly single-crystalline III-N compounds, wherein III denotes at least one element of group III of the Periodic Table of Elements, selected from the group consisting of Al, Ga and In. A corresponding general formula is $Al_xGa_yIn_zN$, wherein $0 \leq x \leq 1$, $0 \leq y \leq 1$, $0 \leq z \leq 1$ and $x+y+z=1$. Examples of possible III-N compounds are quaternary compounds such as (Ga,Al,In)N, ternary compounds such as (Ga,Al)N, (Ga,In)N and (Al,In)N, or binary compounds such as GaN or AlN. Among the selected elements of the group III, such as exemplified in the aforementioned brackets, all conceivable atomic ratios are possible, i.e. from 0 to 100 atom-% for the respective element (for example $(Al,Ga)N=Al_xGa_{1-x}N$, wherein $0 \leq x \leq 1$. (Ga,Al)N and GaN are particularly preferred. The following description of preferred embodiments is not only applicable to the III-N compound examples indicated there, but to all possible III-N compounds, and to devices comprising both III-N semiconductor and other semiconductor materials. The term "mask material" or "compound of the mask material" is understood to mean that the deposition of a III-nitride- or (Al,Ga,In)—N— material on the mask material is inhibited, preferably essentially prevented and more preferably practically entirely prevented. The terms "facet(s)" or "plane(s)" of a crystal have a meaning typical for the person skilled in the art. In accordance with the invention, the possible orientations of a plurality of crystal facets or crystal planes are not limited and are variably selectable and adjustable in a well-aimed manner as desired. The terms "facet(s)" used in the present invention usually mean upper facet(s) of a III-N crystal on which further material is to be layered; the opposite lower face may be a main lower plane or surface, or an interface to a further III-N material or another material. Suitable substrates include, but are not limited to a foreign substrates such as sapphire ($Al_2O_3$), silicon carbide (SiC), or lithium aluminum oxide or lithium gallium oxide (Li(Al,Ga)$O_2$); or native III-N substrates. Further layers may optionally be formed on such substrates, such as buffer layers or barrier layers, to thereby provide templates to be used in the present invention. Materials for such buffer layers, barrier layers or templates preferably include (Ga,Al,In)N-material, and these are preferably epitaxially grown. As an alternative, the III-N layer having more than one facet may be provided on any other base layer or base structure made of any desired material with or without a substrate, for example a semiconductor material other than the (Ga,Al,In)N-material system.

A suitable pre-step, which facilitates to provide the III-N layer having more than one exposed crystal facet(s) at the surface, includes the structuring or patterning of a first mask material formed on a substrate or on a film formed above a substrate. The structuring or patterning of the first mask material on the substrate can be carried out by conventional techniques, including, for example, photolithography, selective etching of a continuous planar layer of a mask material, etc. As the first mask material, an oxide compound or a nitride compound, for example $SiO_2$, silicon nitride (SiN or $Si_3N_4$) or the like, are suitable. The design of the structure or patterning of the first mask can be chosen as desired and suitable; for example, stripes, circular or polygonal islands or other structured matrices, exposed openings or "windows" of the optionally covered substrate material may be formed, preferably in order to subsequently allow epitaxial growth of a III-N layer from the openings or "windows". As techniques for the provision of the III-N layer having more than one exposed crystal facets, processes known as such are suitable, preferably epitaxial growth processes and in particular Metalorganic Vapour Phase Epitaxy (MOVPE) and Hydride Vapor Phase Epitaxy (HVPE) with Epitaxial Lateral Overgrowth (ELO) or Selective Area Growth (SAG). Further epitaxy processes include Molecular Beam Epitaxy (MBE), in particular the Ion Beam Assisted Molecular Beam Epitaxy (IBA-MBE) or the Plasma Assisted Molecular Beam Epitaxy (PAMBE). As an alternative to epitaxy processes, etching techniques of a continuous layer are possible as well, in order to realize a structure having different crystal facets. Techniques for the formation of a continuous layer as well as for the selective etching, such as wet chemical etching, dry etching, reactive ion etching and the like, are known.

According to a preferred aspect of the present invention, on the surface of the III-N layer having multiple crystal facets, mask material is deposited during further growth process on predetermined crystal facets, i.e. only on one or more, but not on all of the accessible crystal facets. Thereby, a mask can be selectively deposited in situ, that is simultaneously with the further epitaxial growth of a III-N layer on one, multiple or all remaining, yet accessible facet(s). This selective deposition is suitably carried out in the same reactor which is used for the growth of the III-N layer. In case that in the previous step for providing the III-N layer having a surface with more than one facet, a (first) mask material was already used, this selective deposition now concerns a second mask material. The material for the second mask may be selected, independently from that of the first mask, among suitable mask materials, preferably among nitride compounds and oxide compounds. The most suitable material for the second mask is a silicon compound, such as silicon nitride, which may be formed in the form of $Si_3N_4$ or another, stoichiometric or non-stoichiometric SiN compound.

The selective deposition can be realized particularly by controlling the growth rates of the different facets in the respectively chosen (Ga,Al,In)N-material system by an aimed adjustment of one or more process parameter(s) during simultaneous presence of constituents for the mask material, such as e.g. silicon. The influences of the process parameters of the MOVPE or the HVPE towards the facets may be selected from the group of conditions comprising the size, the direction or orientation, the material and the fill factor of the first mask, the growth temperature, the reactor pressure, the flow rate of the source compounds, the type and concentration of an inert gas and/or an impurity, and the type of substrate, wherein the adjustments of one or more of the mentioned conditions may be combined. For the description of possible influencing conditions, it is referred to the literature of K. Hiramatsu et al. in phys. stat. sol. (a) 176, p. 535 (1999) as well as the further literature cited therein, wherein K. Hiramatsu et al. and the further literature cited therein are entirely included within the disclosure of this specification by way of reference.

In a particularly efficient embodiment of the present invention, it is safeguarded during the growth process according to the present invention, that a suitable compound for the mask material is selectively deposited on one or more facet(s) which is (are) predominated by a lower and preferably a substantially lower growth rate of the (Ga,Al,In)N-material system compared to the other facet(s). When simultaneously introducing a suitable source for the mask material such as e.g. a suitable silicon source compound, epitaxial growth conditions are selected, wherein a relatively high growth rate of the (Ga,Al,In)N-material system is effected on a first type or a first group of facet(s), whereas in comparison thereto a relatively low, preferably a substantially lower growth rate of the (Ga,Al,In)N-material system is effected on a second type or a second group of facet(s), such that the compound of the mask material is selectively deposited on the second type or group of facet(s). For example, a sufficiently significant ratio between lateral and vertical growth rates is adjusted as described above.

If during this operation sufficient mask material is deposited selectively on the second type or group of facet(s), the growth of the (Ga,Al,In)N-material system on this second type or group of facet(s) may be stopped entirely, but may continuously occur on the first type or group of facet(s), whereby an excellent selectivity is achieved. The selective deposition of the mask material may be effected also in case that constituents of the mask material, such as e.g. silicon, is incorporated into the crystal lattice on the other (i.e. first type or group) facet(s) under the formation of a doped III-N layer. Once the selectivity is achieved and thus sufficient mask material is selectively deposited, the growth conditions may be changed as desired. For example, the supply of a source compound for the mask material into the reactor may be stopped, and/or the relative growth rates for the respective facets may be varied, newly adjusted and/or optionally matched, because the already deposited mask layer inhibits or prevents further growth of a (Ga,Al,In)N-material system on the second type or group of facet(s).

As a result of the process according to the invention in various aspects, a mask material is selectively formed on at least one facet, but leaving at least one of other facet(s) uncovered or essentially uncovered by mask material. In the framework of the present invention, it was surprisingly found that when a source for the mask material is introduced during further epitaxial growth on a III-N layer provided with multiple accessible facets, a selective, facet-specific deposition of the mask material can be controlled most effectively by controlling the facet-specific growth rate of the III-N layer. A relatively low III-N crystal growth rate leads to an excessive deposition of mask material and thus further reduces and even inhibits III-N crystal growth. On the other hand, a relatively high III-N crystal growth rate overcomes a masking effect of a mask material, even if a source for the mask material is present, such that a component of the mask material such as silicon may be incorporated in to the III-N layer as dopant. A balance in the selectivity of depositing mask material and III-N material on different facets may be most effectively controlled by controlling the ratio of vertical to lateral growth rate of the III-N material. Once a sufficient selectivity is reached, further supply of the source of the mask material may be maintained or reduced or even stopped, depending on a desired or accepted degree of doping or on a desired absence of doping in the grown III-N layer.

The selective deposition of the mask material enables that further, preferably simultaneous epitaxial growth of the III-N layer in the same reactor occurs only or essentially only on one or multiple facet(s), which remain uncovered by the mask material. The adjustment of the influencing factors mentioned above during epitaxial growth allows aimed selection on which crystal facet or facets the further epitaxial growth of the III-N layer occurs. Depending on which facet(s) is (are) selected for the further selective growth of a III-N layer, advantageous further developments can be realized, such as the preparation of a free-standing III-N layer of a desired thickness in accordance with the aforementioned first aspect of useful application of the invention; and the deposition of further layers for devices in the III-N-material system or for other semiconductors as defined by the aforementioned second aspect of useful application of the invention. Consequently, free-standing thick III-N layers or predetermined further layers for devices in the III-N material system or other semiconductors may not only be prepared efficiently, but may be provided also with improved and adjustable properties in a well-aimed manner.

It will become apparent to the person skilled in the art that the respective products provided according to the present invention can be further designed, further processed or further modified in accordance with the intended use. For example, the selectively deposited mask material may maintained, but alternatively it may be removed again. Further, a semiconductor material other than III-N compound material, or a further III-N material of a (Ga,Al,In)N composition being independently chosen from, or being adjusted to the (Ga,Al,In)N composition of either the multifacet III-N layer or of the previously facet-selectively grown III-N layer may be deposited on the previously masked facet(s). For example, III-N homostructures and III-N heterostructures having differently composed III-N layers may be obtained in this manner as useful device structures.

Preferably, the band gap within the at least one further III-N layer epitaxially grown selectively on the non-masked first type or a first group of upper facets is smaller than the band gap of other semiconductor layers or other III-N layers of the device or component. This particularly allows for the provision of quantum (hetero)structures, including quantum wells, quantum films, quantum wires and/or quantum dots. As will become further apparent to those skilled in the art, one or more layers for the device may be doped by any suitable dopant.

Examples of possible semiconductor devices having quantum structures in accordance with embodiments of the present invention include, but are not limited to the following: Especially for optoelectronic devices such as lasers or LEDs, a p-doped region is formed above the quantum structure, and subsequently a p-contact is formed thereon. In a preferred embodiment, a thin barrier layer having a high band gap, and being usually composed of the III-N material system, may be formed between the quantum structure and the p-doped region. Further, an n-doped region being n-contacted is typically formed below the quantum structure.

When the semiconductor device according to the present invention is designed as a laser diode, the quantum structure, such as quantum film(s), are typically embedded in wave conducting materials having low refractive index, which is for example made of AlGaN or a modified III-N material. As examples for possible material combinations, there may be mentioned (indicated in the order from bottom to top):

Emission in gree/blue/near-UV: GaN-base layer, InGaN-quantum structure, and GaN-or InGaN-barrier layer;
far-UV: AlN- or AlGaN-base layer, GaN— or AlGaN-quantum structure, and AlGaN-or AlN-barrier layer;
Typically, n-region is formed between substrates and quantum structure, and p-region is formed above the quantum structure.

When the semiconductor device according to the present invention is designed as an electronic device or component, such as a transistor, various consecutive layers having respectively different band gaps or different piezoelectric constants may be used. As an example for a possible material combination, there may be mentioned (indicated in the order from bottom to top) an AlGaN/GaN-FET comprising GaN-base layer, AlGaN-layer, and GaN-layer. The layers may be non-doped (but typically except for a thin, 2d-layer with dopant), or doped (for example with Fe).

The present invention will be explained in more detail by embodiments and examples by reference to the attached drawings, all of which, however, only serve for illustrating the invention and shall not be understood as interpreting the invention in a limitive manner.

FIRST EMBODIMENT

Figure 1:
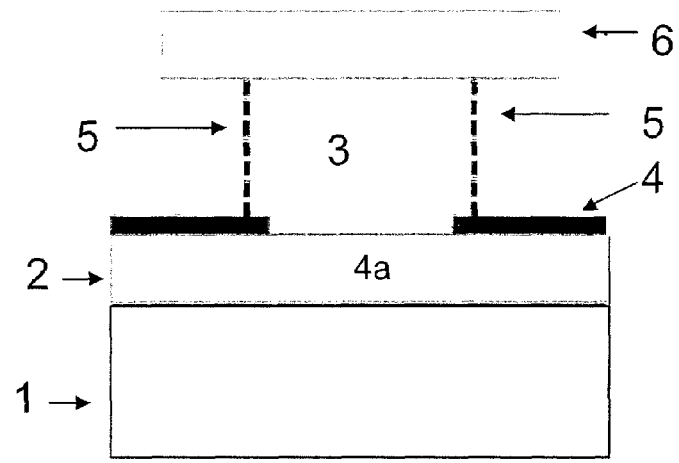
FIG. 1 schematically shows a cross-sectional view of a layer structure of an embodiment of the present invention, wherein an epitaxially grown III-N layer 3 has a top facet and side facets, and mask material 5 is selectively deposited on the side facets, while a further III-N layer 6 is allowed to further grow on the top facet.

First, a III-N layer, here comprising GaN, is formed on a sapphire substrate as a foreign substrate, and a structured surface is generated subsequently. For example, on a first GaN-layer on sapphire a silicon nitride mask, a $SiO_2$ mask or a mask of another material suitable for the ELO process (first mask) is formed on a first GaN-layer on sapphire outside the reactor for epitaxy. A possible process for depositing the mask material includes a sputter process, or a plasma enhanced vapour phase deposition (PECVD). Subsequently, a photoresin is formed on the mask, and a pattern is structured by photolithographic methods. The structure of the photoresin is then transferred onto the mask by dry etching or wet etching processes. Hereby, the mask is removed at the corresponding locations or regions throughout its thickness, such that a GaN surface is exposed at these locations or regions to form a desired pattern of a (first) mask.

Subsequently, a III-N layer, here GaN, is allowed to grow in a reactor for epitaxy, starting from the exposed locations or regions, by means of ELO technology (see S. Bohyama et al. and K. Hiramatsu et al., supra).

During growth on a stripe-patterned mask (first mask) which is patterned in a <11-20> direction, a trapezoidal structure of the GaN-layer having {1-101} facets on the sides and a top (0001) facet is formed first. Essentially independent from the growth parameters, the side {1-101} facets first show a relatively lower growth rate, as long as a top (0001) facet still exists which correspondingly provides a higher growth rate.

Such a structure therefore is well suitable as a starting point for the process according to the invention. Without selective deposition of a mask material at this stage, further growth however would result in an almost standstill of the sides of the trapezoid, and the trapezoid would be filled by the growth of the (0001) facet, until a triangle is formed. Such a complete triangle comprises only {1-101} facets and therefore would be unsuitable.

During growth of a striped mask (first mask), which has been patterned in a <1-100> direction, again morphologies trapezoidal in section having {11-22} facets at the sides and a (0001) facet at the top, or morphologies having rectangular cross-sections with {11-20} facets at the sides and a (0001) facet at the top are formed, depending on the selection of the growth parameters. At higher growth temperatures, for example in the range of about 1070° C.-1150° C., the formation of rectangular structures is enhanced, whereas at relatively lower temperatures, for example in the range of about 1000° C.-1050° C., the trapezoidal structure is enhanced.

For the purpose of the present invention, the ratio of lateral to vertical growth rate in the above-mentioned cases can be adjusted by means of process parameters, while at the same time a source for the deposition of a mask material is introduced into the epitaxy reactor. As source compound for the deposition of the mask material (second mask), for example monosilane or polysilane or monochlorosilane or polychlorosilane, such as e.g. $SiH_4$ is used, which leads in situ with nitrogen source compounds such as, for example, $NH_3$, an alkyl-amine, hydrazine or a monoalkylhydrazine or di-alkylhyrazine, to the deposition of silicon nitride.

Basically, the material for the second mask can be chosen independent from that of the first mask. In combination with the adjusted ratio of lateral to vertical growth rate of the III-V-system, the supply or presence of source compounds of the mask material results in a selective deposition of the (second) mask on the crystal facet(s) having a lower growth rate. A decrease of the reactor pressure, a high V/III-ratio, an addition of nitrogen to hydrogen as inert gas and/or an addition of certain impurities such as, for example, magnesium, enhance the lateral growth rate or reduce the vertical growth rate. In turn, vertical growth can be enhanced in comparison to lateral growth by using a higher reactor pressure, a lower V/III-ratio and/or the use of pure hydrogen or low nitrogen/hydrogen-ratios as inert gas.

According to first-order approximation, the supply of silicon is similar or essentially the same on all facets; likewise, essentially the same amount of silicon per time is incorporated. Much more gallium than silicon is incorporated on facets having a high growth rate; there, a doped semiconductor is obtained. On the other hand, much more silicon than gallium is incorporated into facets having low growth rate; there, a silicon nitride layer is formed, which acts as a mask for further growth.

In a specific example, given for illustrative purpose only, the thus patterned template, starting from a substrate-based GaN layer, which is, for example, 10 nm to 5 µm (here approximately 1.5 µm) thick and exposed in the windows of the first mask, is subjected to a further overgrowth in an Aixtron 200/4RF-S MOVPE device. Here, the temperature lies in the range of 1000° C. to 1100° C., the reactor pressure is in the range of about 100 to 200 mbar, the ammonia ($NH_3$) flow rate is in the range of about 2 to 4 l/min, and the trimethylgallium (TMGa) flow rate lies in the range of about 20 to 100 µmol/min. Trapezoidal, rectangular or triangular structures are formed. Then, $SiH_4$ with a concentration and flow rate of about $3\times10^{-2}$ µmol/min is supplied into the reactor during a time of 2 to 5 minutes. Thereby, a SiN-containing layer is formed on facets having low growth rate, which acts as mask and prevents further growth on these portions. On the other hand, a layer which is merely doped by Si is deposited on facets having higher growth rate, which does not prevent further growth on that portions. As an example, the growth rate in (0001)-direction was set to be 3-fold higher than in {11-20}-direction, or was set to be 15-fold higher than in {1-101}-direction.

Accordingly, in a specific and illustrative example epitaxial growth was carried out according to the invention such that a GaN layer was allowed to grow in the (0001) plane, whereas growth on the {1-101} planes was stopped by selective deposition of mask material (silicon nitride). In the snapshot of a corresponding sample by means of REM according to FIG. 4, it is seen that the growth in the last-mentioned planes was stopped in the lower portion of the structure.

Figure 4:
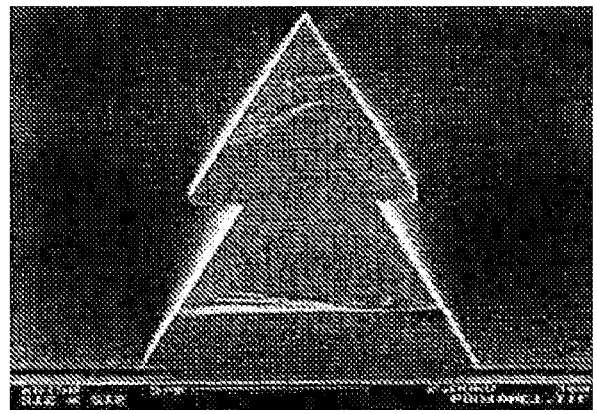
FIG. 4 shows a scanning electron microscopy (REM) photography of an example, in which a III-N layer was allowed to grow in the (0001) plane, whereas the growth on the {1-101} planes were stopped by selective deposition of mask material.
Figure 5:
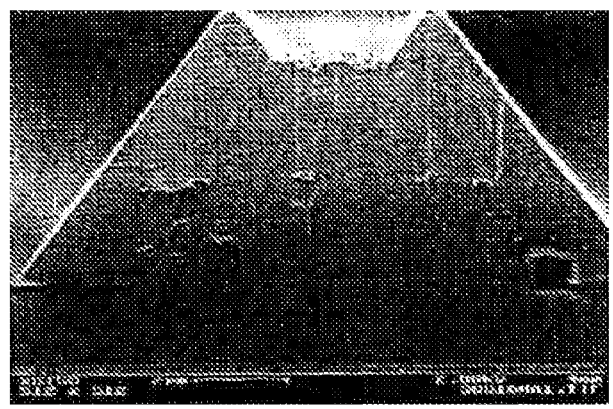
FIG. 5 shows a scanning electron microscopy (REM) photograph of another example, in which, contrary to the example according to FIG. 4, growth on the (0001) plane was stopped by selective deposition of mask material, whereas a III-N layer was allowed to grow in the {11-20} planes.

FIG. 5 shows a REM micrograph of another illustrative example, in which, contrary to the example according to FIG. 4, a first mask was formed in stripes along the <1-100> direction, whereupon growth on the (0001) plane was effectively stopped by selective deposition of mask material (second mask), while a GaN layer was allowed to grow further in the {11-20} planes.

SECOND EMBODIMENT

In this embodiment, the aim is to enable and preferably facilitate self-separation of a bulk III-N layer from a foreign substrate due to thermal strains when cooling, and thus to produce a free-standing, thick III-N layer. For this purpose, a structural instability in the portion between the thick III-N layer and the substrate is generated according to the present invention by the existence of the selective deposition of mask material (second mask).

Hereby, while column-shaped and/or bar-shaped intermediate (inter) layers are allowed to grow, with a growing top plane being parallel to the main surface of the substrate, voids are formed by selective in situ masking of side facets. The thick, bulk III/N-layer, which is allowed to further grow epitaxially on the top plane, is easily separable due to the instable connection with the underneath structure. It may even advantageously separate by itself. The free-standing III-N layer may be further processed as desired, for example by measures to remove any remainder of substrate and/or of the column-shaped and/or bar-shaped intermediate layers. The free-standing III-N layer may be subjected, either one-sided or double-sided, to any desired treatment, for example selected from the group consisting of, but not limited to treatment by solvents such as strong acids (such as $HNO_3/HCl$ like aqua regia); wet chemical or dry chemical etching; mechanic polishing; chemical-mechanical polishing (CMP); and annealing, optionally in a gas atmosphere containing at least ammonia; etc.

By a process according to this embodiment, free-standing III-N layers having diameters of, for example, at least 5 cm (or with basic areas of other structures, such as for example with square of rectangular basic areas of at least 5 cm edge length) and having a thickness in a desired region, for example of at least 20 µm, preferably at least 200 µm, and even at least 300 µm, suitably in a range from the aforementioned respective minima up to 1000 µm, may be realized.

Figure 2:
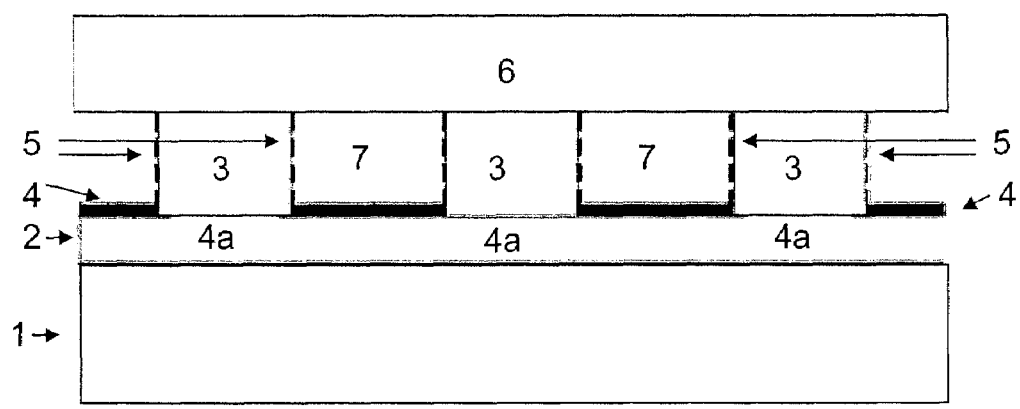
FIG. 2 schematically shows a further development of the embodiment according to FIG. 1, wherein multiple partial structures according to FIG. 1 are adjacently formed and, as a consequence of further growth of the III-N layer, a continuous bulk III-N layer 6 in parallel to the substrate surface is finally formed, which is separated by itself as a free-standing III-N layer.

Referring to FIGS. 1 and 2, a specific and illustrative example relating to this embodiment will be described. Directly on a foreign substrate 1, such as sapphire, or (as shown in the Figures) indirectly on a first III-N layer (here an epitaxially grown GaN-layer) 2 formed on the foreign substrate 1, a first mask 4 is formed and patterned while providing openings or windows 4a, for example by forming a mask material such as SiN by PECVD, patterning the same by a photolithographic process, and subsequently etching the portions of the mask to be removed by wet etching or dry chemical etching. The respective widths and lengths of the mask portions 4 and the openings 4a are respectively freely adjustable in a mutually independent manner, for example in the order of nanometers up to a few micrometers, possibly also up to several tens or even several hundreds of micrometers. If patterns are formed in elongate structures or in stripes, their length is not limited.

On this structured substrate or template, a certain amount, for example up to a thickness in the range of 10 nm to 5 μm (here approximately 1 μm) III-N (here e.g. GaN) is then epitaxially grown, such that III-N structures (layers) 3 having different facets are formed in the openings or windows 4a of the mask. Here, the GaN-layer 3 is allowed to grow (here by MOVPE) starting from the openings such that the structure and its exposed surface is respectively defined by side facets (side planes) and a top facet (top plane). During the growth process it is taken care that two side facets do not become a triangle, or that a coalescence of adjacent structures does not occur, so that the formed surface comprises more than one facet. For this embodiment, structures of the GaN-layer 3 having a small width are preferred, in order to facilitate a fracture and/or a breakage at this location at a later stage. The width of structure 3 therefore lies in the range of approximately the width of the mask opening, typically in the submicron region up to several micrometers. The height of structure 3 approximately lies in the same dimension. The length structure 3 may be unlimited.

In the next step, the mask is selectively deposited. For this, a growth modus having a lower lateral relative to vertical growth rate is selected, as explained above in the first embodiment, and silicon is supplied into the reactor in the form of silane (here $SiH_4$). Since a N-containing gas (here $NH_3$) is contained in the gas mixture, a silicon nitride film 5 is thereby formed on the side facets, which silicon nitride film covers these facets and prevents further growth at the portions. During the deposition of further III-N (here GaN) the structures (layer) 6 practically grow only starting from the top (0001) facet, but subsequently also laterally over the masked facets. As a consequence, by the coalescence of adjacent structures 6, a bulk III-N (here GaN) layer is continuously formed (see FIG. 2). The epitaxial growth can be continued until a desired thickness of the III-N layer is obtained.

The thus formed bulk continuous III-N layer 6 rests on top of the priorly grown structures 3 and is connected with the substrate or template only via them. In the transition region to the substrate 1 or the first III-N layer 2 as shown, the selective masking 5 is formed. Therefore, voids 7 are generated in a well-aimed manner between III-N layer 6 and substrate 1 or first layer 2, which voids make the inter-connection further instable.

During subsequent cooling, high strains are generated due to the different thermal expansion coefficients at the locations of the connection structures 3, which then results in the separation in this region. Thereby, a bulk III-N layer (here GaN-layer) separated from substrate 1 or first layer 2 is obtained.

Concerning the III-N composition (III being selected from Al, Ga and In), the respective atomic ratios of Al, Ga and In, in the layer regions 2, 3 and 6 can be freely selected. In order to reduce the tendency for the generation of crystal defects, the same or a similar composition is preferably chosen in this application embodiment. In the technique described by K. Tomita et al. (see supra), a single masking step outside the reactor is used only. The laterally grown layer is directly connected to the mask, whereby a self-separation is impeded. In JP-A-2004-051415 and JP-A-2004-055799, a patterning must also be carried out by externally forming a mask involving a subsequent etching process with high expenditure. As the sides of the bars or columns as well as the portion between the structures are not protected by a mask in that techniques, growth is enabled also at these portions, the etched exposed portions may be re-covered again, and even crystallites may be formed which drastically deteriorate the quality of the layer. The TiN nano-net described by Y. Oshima et al. and A. Usui et al. (see supra) is produced by an arbitrary process. Therefore, size and interval of the structures between the substrate and the thick GaN-layer may practically not be controlled or adjusted. Therefore, a selective masking is not possible in accordance with this process.

Contrary to the technique described by S. Bohyama et al. (see supra), the external deposition and structuring of a second mask outside the epitaxy reactor, which requires a selective removal of the second mask as well as a laborious and difficult alignment of the second mask onto the structure lying beneath, can be dispensed with according to the present invention. The process according to the present invention therefore needs a significantly lower expenditure. Furthermore, the latitude and the design possibilities of the patterning and structuring as well as the preciseness of the structure formation is significantly improved in the present invention.

Furthermore, the instable connection structure with the combination of bar/void or column/void and mask 5, which is selectively deposited on the side facets of the III-N intermediate (inter) layer 3, significantly facilitates the separation. The height of the connections between substrate or first layer and thick III-N layer can be optionally adjusted over a wide range.

THIRD EMBODIMENT

The aim of this embodiment is to deposit, on a typical (0001)-III-N (here: GaN) wafer, one or more layers (subsequent layers) for semiconductor devices in an aimed manner on desired facets. In a specific example, quantum wells (QW) shall be oriented exclusively in {1-100} planes.

Figure 3:
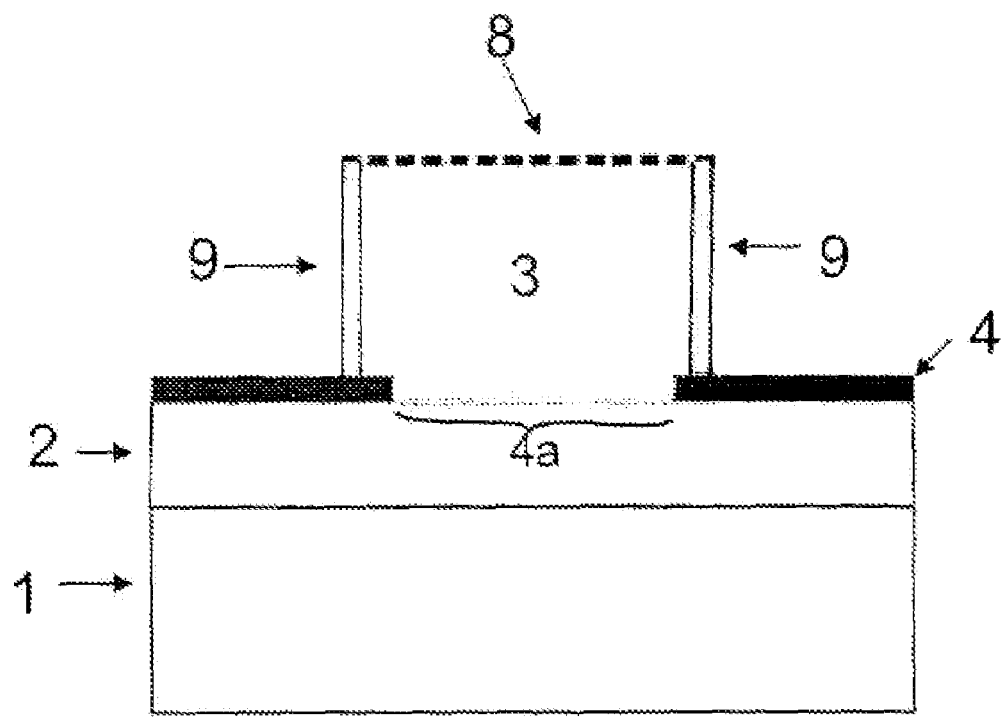
FIG. 3 schematically shows a cross-sectional view of a layer structure of another embodiment of the present invention, according to which, similar to FIG. 1, a formed III-N layer 3 comprises a top facet and side facets, however wherein, different to the first embodiment, mask material 8 is selectively deposited on the top facet, whereas further III-N layers 7 are allowed to respectively grown on the side facets, thereby being non-parallel to the surface of the substrate.

Therefore, in this embodiment of the present invention, starting from a structure having multiple facets, all other facets except for the {1-100} planes/facets are selectively masked in situ such that during the simultaneous and/or in the subsequent growth of the quantum wells, growth will occur only on {1-100} planes/facets. In the embodiment schematically shown in FIG. 3 or a modified embodiment, a first mask 4 is formed and patterned on a foreign substrate 1 (e.g. sapphire) or on a first III-N layer 2. Here, a stripe pattern having stripe-shaped openings/windows 4a in a <11-20> orientation is formed as mask structure. Width and length of the openings 4a are readily choosable depending on the demand or desire. On this structured substrate, a certain amount (to a thickness of suitably 50 nm to 50 μm) III-N (here GaN) is then deposited such that, starting from the openings 4a of the mask, structures 3 rectangular in cross-section are formed, which are defined by vertical {1-100} facets/planes and by the top horizontal (0001) facet/plane. Width and height of structures 3 may lie, corresponding to the selection of the opening width and the opening length as well as the thickness of layer 3, in the sub micrometer or micrometer range, but it is not limited to these dimensions. The length of structures 3 (i.e. extending perpendicular to the plane of the drawing and thus not visible in FIG. 3) may be chosen as desired.

In the next step, a growth modus having lower vertical (relative to lateral) growth rate is selected as described in the first embodiment, and a silicon-containing compound (silane) is supplied into the reactor. Thereby, on the horizontal (0001) facet parallel or essentially parallel to the main surface of the substrate, a silicon nitride film 8 is formed, which covers this facet and prevents further growth at this portion. When depositing further III-N (here GaInN), the structures practically grow only laterally on the basis of the {1-100} side facets. In this manner, quantum wells or films 9 comprising GaInN can be deposited exclusively on the vertical side facets. Such quantum wells/films thus represent subsequent layers selectively formed on a GaN base layer 3 in a well-aimed manner. For the electric contact, the corresponding portions of the subsequent layers can be n- or p-doped in order to obtain a functional semiconductor component or device.

The component or device can be further developed, treated and/or modified as desired. For example, further semiconductor layers, possibly comprising III-N semiconductor material but possibly other semiconductor materials as well, may be formed. First or second mask material may be removed, if desired, by appropriate means such as etching.

When growing quantum wells on structured substrates, however without controlling the growth by selective deposition of the second mask, quantum wells formed on all facets of the surface are usually obtained (see B. Neubert, P. Brückner, F. Habel, F. Scholz, T. Riemann, J. Christen, M. Beer and J. Zweck, Applied Physics Letters 87, 182111-182113 (2005)). Since the properties of quantum wells differ on different facets, such structures are unsuitable for the preparation of semiconductor devices. Contrary to that, it is possible according to the present invention to allow a predetermined type of quantum well to grow on one or more desired crystal facet(s) in an aimed manner. Thereby, the properties of semiconductor devices can be influenced in an aimed manner and can be advantageously adjusted.

In the embodiment described above, quantum wells are formed on a III-N layer, which itself is formed on a basis or template that comprises either a substrate or a first III-N layer formed on a substrate. However, using the same principle of the present invention, quantum structures or other desired III-N layers may be formed selectively on other base structures, which are, for example, constituted without substrate or with other semiconductor base layers.

Further, respective layer(s) may comprise(s) dopants.

FOURTH EMBODIMENT

Various structures comprising subsequent layers for semiconductor devices are produced on sapphire-GaN-templates in a manner described in the third embodiment, wherein the structures differ in the planes in which the quantum films or quantum wells (QW) are allowed to selectively grow, while blocking other crystal planes by selective deposition of the second mask.

Group III-nitrides have a strongly polar crystal structure. A piezoelectric field is thereby formed in quantum wells in the common (0001) planes, which piezoelectric field separates electrons and holes and thereby decreases the efficiency of the semiconductor devices such as e.g. LEDs and lasers (quantum confined Stark effect) (see B. Neubert et al., supra). When the quantum wells, however, are formed in the direction of these fields (a {1-100} plane, or also in technically less relevant {11-20} planes), this effect is diminished, and the semiconductor device becomes more efficient. By positioning the quantum wells in {1-101} or {11-20} planes, a reduction of this effect is already enabled, and the efficiency is slightly increased. Quantum wells in these planes may be realized already by depositing a structure 3 alone, i.e. a structure corresponding to a conventional ELO process, together with a subsequent growth of one or more thin III-N layers of for example few or several nm having a reduced band gap. However, the quantum wells are then always deposited on all non-masked crystal facets, i.e. it is not possible in this manner to obtain quantum wells e.g. in the {1-100} plane only, because quantum wells in the (0001) plane are always obtained, too. Further, due to different incorporation efficiencies of the individual components, it is to be expected, that the band gap of the quantum wells in the various planes are quantitatively different.

Only by the aimed and selective masking according to the present invention for crystal planes other than that (or those), in which the quantum wells shall be oriented, it is realized that only desired and prescribed quantum wells are deposited. After the selective masking, basically all possible subsequent layers for a desired semiconductor devices may be deposited. According to the present invention, it is particularly efficient to realize application cases, in which the selective masking is formed on the facet which extends parallel in plane to the main surface of the substrate, and the subsequent layers for the semiconductor element are formed on at least one facet which is (are) not parallel in plane to the surface of the substrate. By transferring the layer(s) from the common (0001) plane onto the desired plane(s), the thickness or the composition of the layers is possibly changed. This may be corrected as desired.

By the process according to the invention, for example the growth of epitaxial layers of quantum wells can be carried out on specifically desired planes, like on the {1-100} plane as in the third embodiment, in the following planes:

{1-101} planes
{11-22} planes
{11-20} planes.

For electric contact, the respective regions of the subsequent layers are again n- or p-doped in order to obtain a functional semiconductor element.

Instead of quantum wells described in the third or fourth embodiment, quantum dots or quantum wires may be generated, in order to improve properties of the semiconductor devices. These forms of layers may also be transferred from the (0001) plane to other planes by the process according to the invention.

By the processes of the third or fourth embodiment, heterostructures, such as GaInN—GaN-heterostructures or the like, can be produced being essentially free of internal fields. The crystal plane, in which the subsequent layer(s) is (are) layered, may beneficially have piezoelectric constants other, preferably lower that the original crystal plane of the substrate.

By the processes of the third or fourth embodiment, it is beneficially possible that the band gap within the subsequent layer(s) may be made smaller than the band gap of a semiconductor surrounding the subsequent layer(s).

As in the third embodiment, the fourth embodiment likewise allows modifications within the scope of the present invention, for example by forming the subsequent layers for the semiconductor device not only on a substrate or a first III-N layer formed on a substrate, but forming the same selectively on other base structures which are constituted e.g. without a substrate or with another semiconductor base layer.

Further, layer(s) may comprise(s) dopants.

As in the third embodiment, the resulting component or device of the fourth embodiment may be further developed, treated and/or modified as desired. For example, further semiconductor layers, possibly comprising III-N semiconductor material but possibly other semiconductor materials as well, may be formed.

Although the present invention has been described by reference to preferred embodiments, specific examples and illustrative drawings, these descriptions and drawings shall not be interpreted to limit the present invention thereto. However, the skilled person may carry out modifications within the spirit and scope of the invention as defined by the appended claims.

What is claimed is:

1. A process for the formation of a mask material on a III-N layer, wherein III denotes at least one element of group III of the Periodic Table of Elements, selected from Al, Ga and In, the process comprising:
    providing a III-N layer having a surface which comprises more than one facet; and
    depositing a mask material selectively on one or more, but not on all facets;
    wherein the depositing is carried out simultaneously with epitaxially growing a further III-N layer on at least one facet where the mask material is not deposited.

2. The process according to claim 1, wherein the providing the III-N layer comprises growing the III-N layer in a reactor, and wherein the depositing is carried out within the reactor.

3. A process for the growth of an at least partially masked III-N layer by means of epitaxy, wherein III denotes at least one element of group III of the Periodic Table of Elements, selected from Al, Ga and In, the process comprising:
    providing a III-N layer having a surface, which comprises more than one facet;
    carrying out epitaxial growth under growth conditions;
    whereby a growth of at least one further III-N layer selectively on a first type or a first group of facet(s) and a deposition of mask material selectively on a second type or a second group of facet(s) proceed simultaneously.

4. The process according to claim 3, wherein epitaxial growth is carried out, during at least a part of the growth process, under growth conditions such that at least one source for the mask material is supplied to the epitaxy reactor, and that the growth rate for the III-N material system on the first type or group of facet(s) is higher relative to the growth rate on the second type or group of facet(s).

5. A process for growth of an at least partially masked III-N layer by means of epitaxy in an epitaxy reactor, wherein III denotes at least one element of group III of the Periodic Table of Elements, selected from Al, Ga and In, the process comprising:
    performing epitaxial growth for the III-N layer, during at least a part of the growth process, under growth conditions where growth rates of lateral growth and vertical growth respectively are different; and
    supplying, during a period of respectively different lateral and vertical growth rates, at least one source for a mask material into the epitaxy reactor.

6. The process according to claim 1, wherein the mask material comprises a nitride compound or an oxide compound.

7. The process according to claim 1, wherein the mask material comprises a silicon compound.

8. The process according to claim 1, wherein the mask material comprises silicon nitride, which is deposited by using ammonia or an amine, and a silane or a chlorosilane.

9. The process according to claim 1, wherein the mask material comprises silicon nitride, and is deposited by using $NH_3$ or $(CH_3)_2NNH_2$, and $Si_xH_{2l+2}$ or $Si_xCl_mH_n$, wherein x is an integer from 1 to 8, and m and n, respectively, are 0 or an integer with a sum of 2l+2.

10. The process according to claim 1, wherein the deposited mask material is a second mask material, and wherein the process further comprises:
    forming a pattern of first mask material on a substrate, a template or a base layer; and
    subsequently growing the III-N layer having the surface with more than one facet, starting from the non-masked portions of the pattern.

11. The process according to claim 1, wherein the III-N layer is grown by means of MOVPE or HVPE.

12. A process for preparation of a free-standing III-N layer, wherein III denotes at least one element of the group III of the periodic Table of Elements, selected from Al, Ga and In, the process comprising the steps of:
    performing a process according to claim 1 for forming a selectively masked III-N layer above a substrate, a template or a base layer; and
    forming another III-N layer,
    wherein selective masking is formed in a region between the other III-N layer and the substrate, the template or base layer, and
    causing said other III-N layer to separate from the substrate, the template or the base layer, thereby providing the free-standing III-N layer.

13. The process according to claim 12, wherein voids are generated between the substrate and the other III-N layer due to the selective masking, or wherein the other III-N layer is capable of self-separating from the substrate, the template or the base layer.

14. The process according to claim 12, wherein the other III-N layer is connected to the substrate, the template or the base layer through spaced apart bars or through spaced apart columns.

15. The process according to claim 12, wherein selective masking is formed on one or more facet(s) other than the facet which is parallel in plane to the main surface of the substrate, the template or the base layer.

16. The process according to claim 12, wherein the other III-N layer is formed to have a desired thickness by epitaxial growth, the epitaxial growth process being MOVPE or HVPE.

17. A process for producing a device comprising a III-N material, wherein III denotes at least one element of the group III of the Periodic Table of Elements, selected from Al, Ga and In, the process comprising the steps of:
    performing a process according to claim 1 for forming a selectively masked III-N layer above a substrate, a template or a base layer such that selective masking is formed on at least one facet of a formed multi-facet III-N layer; and
    forming at least one layer for the device on at least one non-masked facet(s).

18. The process according to claim 17, further comprising forming a selective masking on a facet which is oriented in plane parallel to the main surface of the substrate, the template or the base layer; and wherein the at least one layer for the device is formed on at least one of other facets which are not parallel in plane to the main surface of the substrate, the template or the base layer.

19. The process according to claim 17, wherein the at least one layer for the device comprises a quantum structure.

20. The process according to claim 17, wherein the at least one layer for the device is formed by epitaxial growth, the epitaxial growth process being MOVPE or HVPE.

* * * * *